US009245819B2

(12) United States Patent
Vincent

(10) Patent No.: US 9,245,819 B2
(45) Date of Patent: Jan. 26, 2016

(54) EMBEDDED ELECTRICAL COMPONENT SURFACE INTERCONNECT

(75) Inventor: Michael B. Vincent, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 694 days.

(21) Appl. No.: 13/402,413

(22) Filed: Feb. 22, 2012

(65) Prior Publication Data

US 2013/0215583 A1 Aug. 22, 2013

(51) Int. Cl.
*H05K 3/30* (2006.01)
*H01L 23/433* (2006.01)
(Continued)

(52) U.S. Cl.
CPC ........ *H01L 23/4334* (2013.01); *H01L 21/6835* (2013.01); *H01L 23/315* (2013.01); *H01L 24/19* (2013.01); *H01L 24/20* (2013.01); *H01L 24/27* (2013.01); *H01L 24/29* (2013.01); *H01L 24/73* (2013.01); *H01L 24/92* (2013.01); *H01L 23/3737* (2013.01); *H01L 24/13* (2013.01); *H01L 24/94* (2013.01); *H01L 2221/68327* (2013.01); *H01L 2221/68381* (2013.01); *H01L 2224/12105* (2013.01); *H01L 2224/131* (2013.01); *H01L 2224/27002* (2013.01); *H01L 2224/279* (2013.01); *H01L 2224/2732* (2013.01); *H01L 2224/2748* (2013.01); *H01L 2224/2784* (2013.01); *H01L 2224/27312* (2013.01); *H01L 2224/27318* (2013.01); *H01L 2224/27848* (2013.01); *H01L 2224/28105* (2013.01); *H01L 2224/293* (2013.01); *H01L 2224/29011* (2013.01); *H01L 2224/29013* (2013.01); *H01L 2224/29014* (2013.01); *H01L 2224/29015* (2013.01); *H01L 2224/29017* (2013.01); *H01L 2224/29022* (2013.01); *H01L 2224/2929* (2013.01); *H01L 2224/29339* (2013.01);

(Continued)

(58) Field of Classification Search
CPC ... H01L 23/4334; H01L 23/315; H01L 24/92; H01L 24/20; H01L 24/19; H01L 24/27; H01L 24/29; H01L 24/73; H01L 21/6835; H01L 2224/2784; H01L 2224/279; Y10T 29/49146
USPC ............ 29/841, 825, 829, 832, 846; 361/754, 361/767, 783; 257/690, 775, 778, 785, 787, 257/701; 174/260
See application file for complete search history.

(56) References Cited

U.S. PATENT DOCUMENTS 4,783,695 A * 11/1988 Eichelberger et al. ........ 257/668
5,353,498 A * 10/1994 Fillion et al. .................... 29/840

(Continued)

*Primary Examiner* — Peter DungBa Vo
*Assistant Examiner* — Jeffrey T Carley

(57) ABSTRACT

An electrical component package is disclosed comprising: an electrical component having an embedded surface, a structure attached to the electrical component opposite the embedded surface, a conductive adhesive directly attached to the embedded surface, where the conductive adhesive is shaped to taper away from the embedded surface, and an encapsulation material covering the conductive adhesive and the electrical component. In various embodiments, the tapered conductive adhesive facilitates the securing of the conductive adhesive to the electrical component by the encapsulation material. Also disclosed are various methods of forming an electrical component package having a single interface conductive interconnection on the embedded surface. The conductive interconnection is configured to maintain an interconnection while under stress forces. Further disclosed in a method of applied a conductive adhesive that enables design flexibility regarding the shape and depth of the conductive interconnection.

15 Claims, 4 Drawing Sheets

(51) Int. Cl.
*H01L 21/683* (2006.01)
*H01L 23/31* (2006.01)
*H01L 23/00* (2006.01)
*H01L 23/373* (2006.01)

(52) U.S. Cl.
CPC .......... *H01L2224/29344* (2013.01); *H01L 2224/29347* (2013.01); *H01L 2224/29355* (2013.01); *H01L 2224/73153* (2013.01); *H01L 2224/81191* (2013.01); *H01L 2224/83191* (2013.01); *H01L 2224/92* (2013.01); *H01L 2224/94* (2013.01); *H01L 2924/3511* (2013.01); *H01L 2924/35121* (2013.01); *Y10T 29/49146* (2015.01)

(56) References Cited

U.S. PATENT DOCUMENTS

| | | | | |
|---|---|---|---|---|
| 5,497,033 | A | 3/1996 | Fillion et al. | |
| 5,701,034 | A | 12/1997 | Marrs | |
| 6,570,247 | B1 | 5/2003 | Eiles et al. | |
| 6,674,172 | B2 * | 1/2004 | Vincent | 257/777 |
| 2002/0068379 | A1 * | 6/2002 | Cobbley et al. | 438/106 |
| 2003/0094677 | A1 * | 5/2003 | Cheng | 257/676 |
| 2004/0063252 | A1 * | 4/2004 | Takahashi | 438/123 |

* cited by examiner

Figure 1 – Prior Art

EMBEDDED ELECTRICAL COMPONENT SURFACE INTERCONNECT

FIELD

This disclosure generally relates to systems, devices, and methods associated with interconnects of embedded electrical components.

BACKGROUND

An electrical component package, such as a die package, is typically encapsulated to protect the sensitive components. The electrical component package has an electrical component 101, such as a die, with a first side that may be connected to a structure having circuitry, in general, and with reference now to FIG. 1, an electrical component package 100 comprises an electrical component 101 having a second side (e.g., embedded surface 111) embedded by an encapsulation material 102, and a structure (build-up circuitry) 103. Connections to electrical component 101 are made via the interface of electrical component 101 and structure 103, and are limited to one side of electrical component 101.

Another prior art configuration is a metal slug (such as copper) forming, along with a layer of adhesive or other material, an interconnection with the embedded surface of an electrical component. The metal slug typically attaches to the embedded surface using a general adhesive or solder. However, applying stress to this configuration may result in a disconnect forming between the metal slug and the embedded surface caused by the slug breaking away.

FIGURES

A more complete understanding of the present disclosure may be derived by referring to the detailed description and claims when considered in connection with the Figures, wherein like reference numbers refer to similar elements throughout the Figures, and:

Skilled artisans appreciate that elements in the figures are illustrated for simplicity and clarity and have not necessarily been drawn to scale. For example, the dimensions of some of the elements in the figures may be exaggerated relative to other elements to help improve the understanding of the various embodiments of the present disclosure.

DETAILED DESCRIPTION

In accordance with various embodiments, systems, devices, and methods are provided, for among other things, manufacturing an embedded surface adhesive interconnection. The following descriptions are not intended as a limitation on the use or applicability of the disclosure, but instead, are provided to enable a full and complete description of various embodiments.

A new electrical component package and method of manufacturing the electrical component package is disclosed. As described in greater detail herein, in various embodiments, the electrical component package comprises an electrical component in an at least partially encapsulated package with embedded surface interconnections. The embedded surface interconnections may comprise a conductive adhesive material directly attached to the embedded surface of the electrical component. The conductive adhesive material may be configured for an electrical, thermal, optical and/or other connection. Further, the conductive adhesive material may be shaped to taper away from the embedded surface, and may be secured to the electrical component by an encapsulation material covering the conductive adhesive and the electrical component. As used herein, "directly attached to" may include interfacing with, connected to touching or any other interface having none or minimal materials therebetween.

Additionally, various methods of manufacturing may include placing an electrical component on a structure, applying conductive adhesive to the electrical component in a desired shape, curing the conductive adhesive, applying an encapsulation material to at least partially cover the electrical component and the conductive adhesive, curing the encapsulation material (wherein the encapsulation material secures the conductive adhesive to the electrical component) and forming a conductive interconnect by removing the encapsulation material to a specific level in order to expose the conductive adhesive. In various embodiments, the conductive adhesive material is initially built up to extend past the encapsulation material level, and then the conductive adhesive material is removed to a desired level to form the conductive interconnect. For example, the desired level of conductive adhesive material may be the same level as the encapsulation material, making the surface approximately flush. In various embodiments, the conductive adhesive material is built up to a desired level and no removal of the conductive adhesive or the encapsulation material level is needed to form the conductive interconnect.

Figure 1:
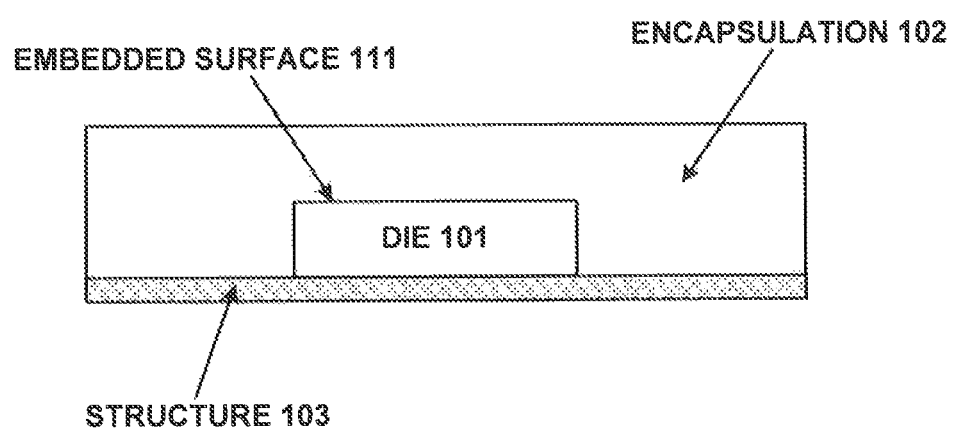
FIG. 1 illustrates a prior art die package with single side interconnections.
Figure 2:
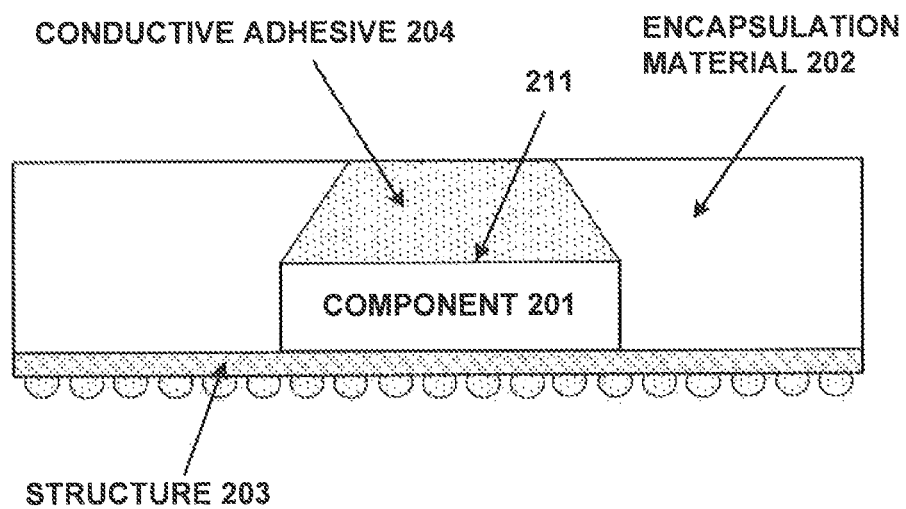
FIG. 2 illustrates an electrical component package with embedded surface interconnections in accordance with various embodiments.

In various embodiments, electrically conductive adhesive (ECA), a thermally conductive adhesive (TCA), or an optically conductive adhesive (OCA) may be applied to a surface of an electrical component prior to encapsulation. In one example, EPO-TEK® H20E-PFC may be used as the ECA. In another example, GE-3281 manufactured by General Electric Corporation may be used as the TCA. In yet another example, EPO-TEK® 353ND may be used as the OCA. The adhesive may be secured to the electrical component during the encapsulation process. To form an interconnection, the encapsulation material is removed to a desired level in order to access the adhesive interconnects. In various embodiments, and with reference to FIG. 2, an electrical component package 200 comprises an electrical component 201 having an embedded surface 211, an encapsulation material 202, a structure 203 (also referred to as build-up circuitry), and conductive adhesive 204. Connections to electrical component 201 are made via the interface of electrical component 201 and structure 203, and may also be made via the interface of electrical component 201 and conductive adhesive 204. Connecting to embedded surface 211 (e.g., for electrical or thermal reasons) enables smaller and denser semiconductor packaging.

One major difference between an embedded surface interconnect using a metal slug and electrical component package 200 with conductive adhesive 204 is the number of interfaces. Electrical component package 200 with conductive adhesive 204 has a single interface between the two components. In other words, conductive adhesive is directly connected to electrical component 201. A single interface has higher reliability of maintaining a sufficient pathway compared to a package with multiple interfaces. Various prior art configurations use an electrical component, adhesive, and metal connector, where the adhesive is between the embedded surface and the metal connector. The metal connector may also be soldered to the electrical component. In general, the multiple interfaces are inherently less reliable than a single interface. A primary issue with a multiple interface configuration is separation at one of the interfaces. Separation may occur during the manufacturing process due to loosening at the interface connection. For example, grinding the metal connector may dislodge the connection between the metal connector and the electrical component due to stress and vibration.

Processing of an exemplary electrical component package with an adhesive interconnection is more reliable due to the material of conductive adhesive 204. In various embodiments, conductive adhesive 204 may be an ECA comprising adhesive resin and electrically conducting particles. Examples of an electrically conductive particle include metals such as gold, silver, copper, nickel, and solder though other electrically conductive metals may be used as would be known to one skilled in the art. In various embodiments, conductive adhesive 204 may be a thermally conductive material configured to form a thermal contact. More specifically, a thermally conductive adhesive 204 may comprise an adhesive resin and at least one of electrically conductive material or thermally conductive material. Thermally conductive material may be any material that provides good thermal conductivity. The thermally conductive adhesive 204 may or may not be electrically conductive.

In various embodiments, conductive adhesive 204 may contain optically conducting material for creating optical interconnects. The optically conducting material may be optically transparent material, such as photopolymers, silicones, or acrylic-, urethane-, and polyvinyl alcohol-based resins. As used herein, optically conductive encompasses transmitting visible radiation, infrared radiation, and ultraviolet radiation. Further, in various embodiments, the electrical component may include optoelectronic components and devices.

One aspect of conductive adhesive 204 is the viscosity of the material in the uncured state. In various embodiments, conductive adhesive 204 is able to maintain a selected shape and form. In various embodiments, electrical conductive adhesive 204 has a viscosity of about 1 kcps to about 20 kcps in an uncured state. In other various embodiments, uncured thermal conductive adhesive 204 has a viscosity of about 1 kcps to about 50 kcps. Another property of uncured conductive adhesive 204 is the thixotropic index, which relates to the property of thinning in response to shear stress being applied and thickening in response to shear stress being removed from the adhesive, in various embodiments, conductive adhesive 204 comprises a resin and filler mixture having a high thixotropic index. For example, conductive adhesive 204 may have a thixotropic index of about 2 to about 8.

The selected material properties of conductive adhesive 204 enable the material to assume different shapes and maintain desired thickness when applied to electrical component 201. In various embodiments, conductive adhesive 204 is applied to electrical component 201 in order to form a shape that provides an "anchoring" effect by encapsulation material 202. The conductive adhesive shape is configured for anchoring by shaping the conductive adhesive to have a wider area in contact with the embedded surface relative to conductive adhesive side that is opposite the embedded surface interface. One example of a conductive adhesive shape is a cone, where a larger base is attached to the embedded surface and tapers away from the electrical component. Since the area of the cone attached to the electrical component tapers away from the electrical component, the conductive adhesive is anchored by the encapsulate material. The anchoring of the conductive adhesive facilitates maintaining an interface between the embedded surface and the conductive adhesive when stress is applied, such as during removal of the encapsulation material.

Various methods may be used for shaping the conductive adhesive. Some of the methods include grinding, ablating, molding, and/or a combination of material properties and dispensing methods. For example, grinding and/or ablating the conductive adhesive for shaping may include removal of cured or partially cured conductive adhesive on one or more sides. In various embodiments, the sides of the conductive adhesive are removed to form an angle of 90° or less relative to the embedded surface of the electrical component, which facilitates the anchoring effect previously described. With respect to forming a shape using a mold, conductive adhesive may be injected into a mold coupled to the electrical component. The mold may take the form of a desired shape as would be known to one skilled in the art. Additionally, conductive adhesive may be shaped using a combination of material properties and dispensing methods. The material properties include using the surface tension of the adhesive to take the shape of the electrical component and typically resulting in curved edges, which facilitate the anchoring effect, as previously described. An example of a dispensing method is using a needle to dispense the adhesive onto the electrical component, and varying the distance between the component and the needle during the dispensing. By increasing the distance of the needle during the dispensing, a conical shape is created. The conical shape may be concave or convex, depending on the speed of the needle motion and the conductive adhesive material properties.

Figure 3:
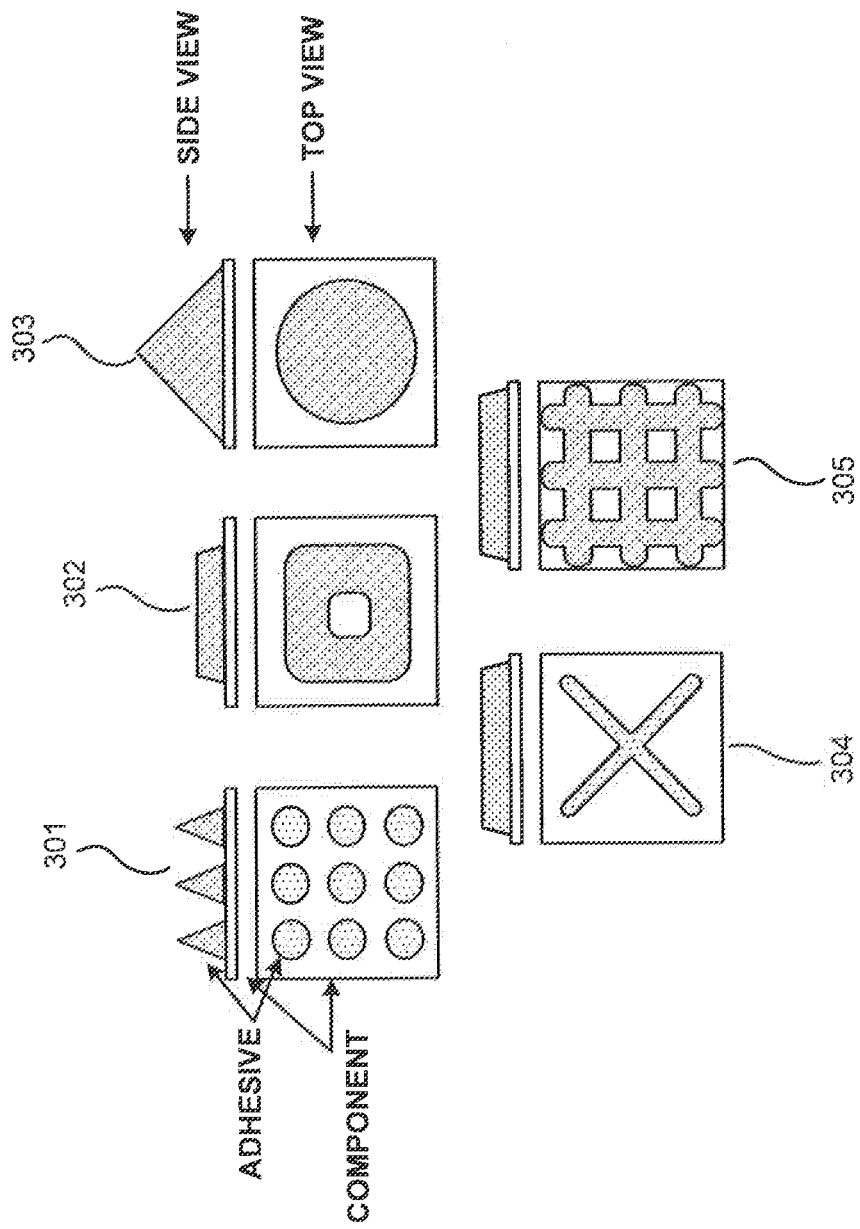
FIG. 3 illustrates embedded surface interconnections of an electrical component with varying shapes in accordance with various embodiments.

Additionally, in various embodiments and with reference to FIG. 3, the conductive adhesive may be applied to the electrical component in various shapes and configurations. For example, conductive adhesive may be applied as multiple conical shapes 301 or as a large conical shape 303. Further, conductive adhesive may be applied as a rectangle and may have an empty center 302. Moreover, conductive adhesive may be applied in overlapping lines, such as a crossover 304 or in a lattice configuration 305. Further, in various embodiments, multiple shapes and arrays may be formed from a combination of the different shapes and configurations. Other shapes are also contemplated, as would be known to one skilled in the art.

From a sectional viewpoint perpendicular to the embedded surface interconnect, the conductive adhesive may be in various shapes and configurations. For example, the conductive adhesive may be tapered and have a triangular or trapezoidal shape. In another example, the conductive adhesive may have a sectional shape of a circular segment. As used herein, a circular segment is defined as the area formed by a chord of a circle and an arc lying between the chord's endpoints. The circular segment may range from a small segment of a circle to a substantially complete segment of a circle.

Figure 4:
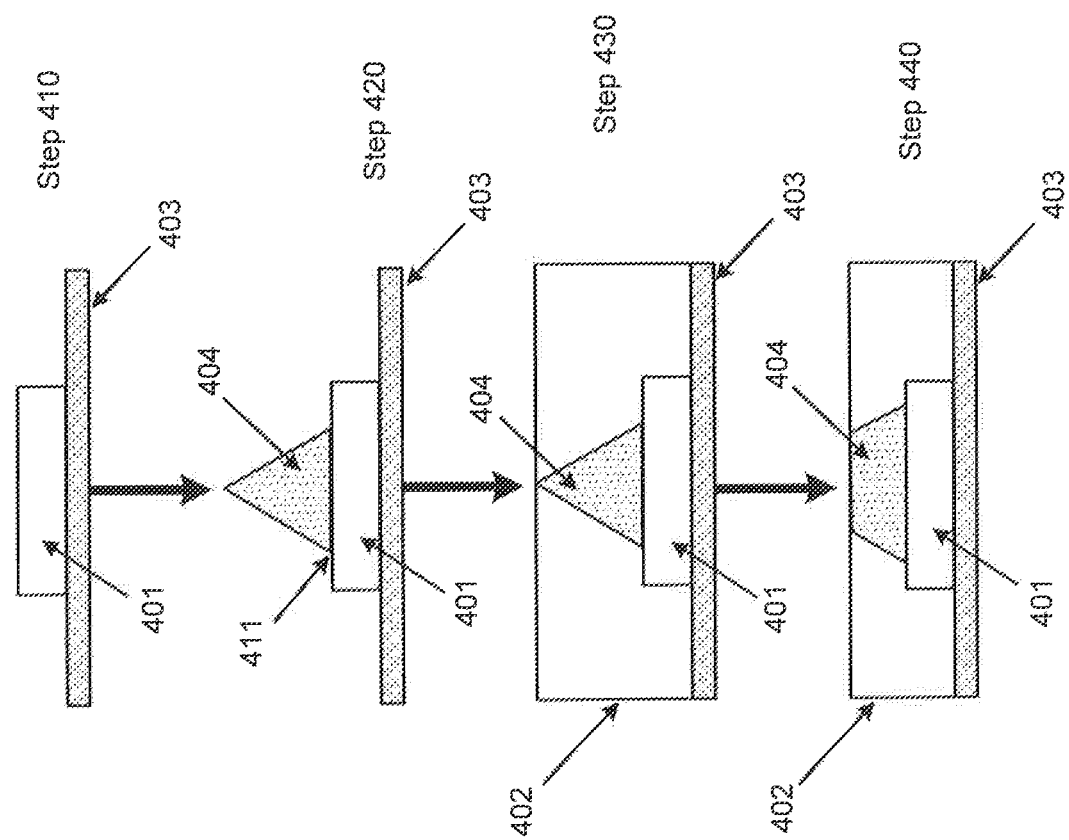
FIG. 4 illustrates an exemplary method of forming an electrical component package with embedded surface interconnections.

The electrical component package may comprise any suitable shape and configuration of conductive adhesive, but several methods for forming such embodiments are described herein. In an exemplary method, and with reference to FIG. 4, an electrical component 401 may be placed on a support structure 403, which provides support for electrical component 401 (step 410). Attaching electrical component 401 to support structure 403 prior to application of an adhesive may prevent or reduce warping of electrical component 401, in the prior art, application of heat to an electrical component may have caused warping. However, a conductive adhesive can be applied to electrical component 401 before electrical component 401 is attached to support structure 403.

A conductive adhesive 404 may be applied to electrical component 401 in various shapes as previously described (step 420). Conductive adhesive 404 may be applied by dispensing, jetting, stencil printing, and/or the like. After conductive adhesive 404 is applied to electrical component 401, the package is cured or partially cured. Further, an encapsulation material 402 is applied to electrical component 401 and conductive adhesive 404 structure (step 430). The encapsulation material 402 is cured and attaches to electrical component 401 and also secures conductive adhesive 404 to electrical component 401. After curing, encapsulation material 402 may be removed in order to expose conductive adhesive 404 and form a conductive adhesive interconnect (step 440). The encapsulation material may be removed by grinding or ablating it down. The encapsulation material may also be removed by cutting and/or laser cutting the package. The encapsulation material 402 may be removed to a desired depth, which controls the exposure of conductive adhesive 404. For example, if conductive adhesive 404 is a conical or trapezoidal shape, additional removal of encapsulation material 402 creates a larger diameter of accessible conductive adhesive 404.

Partially curing the conductive adhesive 404 involves curing until the conductive adhesive is sufficiently rigid to hold a desired shape during the remaining assembly process. A benefit to partial curing is that conductive adhesive 404 is more rigid than uncured adhesive, and that removal of support structure 403 is more controlled if the conductive adhesive is not fully cured. The controlled removal may be due to support structure 403 having temperature sensitive properties. The process and temperature for fully curing conductive adhesive 404 may result in the separation of support structure 403 from electrical component 401, which may not be desirable until after an encapsulation material is applied.

Furthermore, in various embodiments, support structure 403 may be removed and one or more electrical distribution layers may be formed on the other side of the structure for electrically coupling to electrical component 401. Removal of support structure 403 exposes the active side of electrical component 401. An electrical distribution layer may be formed over, and electrically connects to, the active side of electrical component 401. In various embodiments, the electrical distribution layer may be formed using known photolithography and plating processes. In various embodiments, the electrical distribution layer is formed using a redistributed chip packaging (RCP) process. Moreover, a plurality of conductive bumps may be formed on the electrical distribution layer. The conductive bumps allow electrical interconnection to electrical component 401. In various embodiments, the plurality of conductive bumps may comprise solder balls.

In various embodiments of processing, the electrical component is a die and the conductive adhesive may be applied to the die in wafer form. The conductive adhesive may be applied by dispensing, jetting, stencil printing, and/or the like. The conductive adhesive may be cured to the die while still in wafer form. In response to the wafer being singulated, the die may be placed on a carrier substrate, encapsulation material added, and cured. Similar to the process already described, the encapsulation material may be ground down to expose the conductive adhesive.

In various embodiments of processing, an electrical component may be placed on a structure and conductive adhesive applied to the electrical component. The encapsulation material may be applied to the conductive adhesive and electrical component prior to any curing. The conductive adhesive and encapsulation material may be cured in the same step. Thereafter, the encapsulation material may be ground down to expose the conductive adhesive, similar to the previous description.

After the conductive adhesive is exposed and anchored to the electrical component, further processing may be undertaken to electrically and/or thermally sink with the conductive adhesive interconnect. Applications for the systems, devices, and methods described herein include redistributed chip packaging (RCP) applications using electrical, thermal, or optical contact to the embedded surface.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, couple may mean that two objects are in communication with each other, and/or communicate with each other, such as two pieces of hardware. Furthermore, the term "and/or" may mean "and", it may mean "or", it may mean "exclusive-or", it may mean "one", it may mean "some, but not all", and/or it may mean "both", although the scope of claimed subject matter is not limited in this respect.

The detailed description herein makes reference to the accompanying drawings, which show various embodiments by way of illustration. While these exemplary embodiments are described in sufficient detail to enable those skilled in the art to practice the disclosure, it should be understood that other embodiments may be realized and that logical and mechanical changes may be made without departing from the spirit and scope of the disclosure. Thus, the detailed description herein is presented for purposes of illustration only and not of limitation. For example, the steps recited in any of the method or process descriptions may be executed in any order and are not limited to the order presented. Moreover, any of the functions or steps may be outsourced to or performed by one or more third parties. Furthermore, any reference to singular includes plural embodiments, and any reference to more than one component may include a singular embodiment.

Systems, devices, and methods are provided. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. After reading the description, it will be apparent to one skilled in the relevant art(s) how to implement the disclosure in alternative embodiments.

While the principles of the disclosure have been shown in embodiments, many modifications of structure, arrangements, proportions, the elements, materials and components, used in practice, which are particularly adapted for a specific environment and operating requirements without departing from the principles and scope of this disclosure. These and other changes or modifications are intended to be included within the scope of the present disclosure and may be expressed in the following claims.

I claim:

1. A method of forming an electrical component package, the method comprising:
   applying conductive adhesive material to an electrical component to form a build-up shape, wherein
      the electrical component has a first side attached to a support structure surface,
      the build-up shape has a first surface in contact with a second side of the electrical component, the second side opposing the first side,
      the build-up shape has a second surface opposing the first surface, and
      a first area of the first surface is larger than a second area of the second surface;
   applying an encapsulation material over the electrical component and the build-up shape, wherein
      the encapsulation material has a bottom surface in contact with the support structure surface,
      the encapsulation material has a top surface opposing the bottom surface, and
      the encapsulation material extends from the support structure surface to the to surface and surrounds and covers the electrical component and the build-up shape; and
   forming a conductive interconnect by removing a top portion of the encapsulation material that includes the to surface of the encapsulation material to a specific level in order to expose the build-up shape, wherein the build-up shape has an exposed top surface that is level with an exposed top surface of the encapsulation material after the removing.

2. The method of claim 1, further comprising at least partially curing the conductive adhesive material prior to the applying the encapsulation material.

3. The method of claim 1, further comprising curing the conductive adhesive material and the encapsulation material after the applying the encapsulation material.

4. The method of claim 1, wherein the conductive adhesive material comprises adhesive resin and electrically conducting particles.

5. The method of claim 1, wherein the forming the conductive interconnect further comprises removing a top portion of the build-up shape that includes the second surface of the build-up shape, wherein the exposed top surface of the build-up shape is exposed after the top portion of the build-up shape is removed, and wherein the exposed top surface of the build-up shape has an area larger than the second area of the second surface of the build-up shape.

6. The method of claim 1, wherein the conductive adhesive material has a viscosity in a range of about 1 kcps to about 20 kcps in an uncured state.

7. The method of claim 1, wherein the conductive adhesive material has a thixotropic index in a range of about 2 to about 8 in an uncured state.

8. The method of claim 1, wherein the electrical component is a die, and wherein the die is part of a wafer during the applying the conductive adhesive material to the die, and wherein the die is singulated from the wafer after the applying the encapsulation material.

9. The method of claim 1, wherein the removing exposes the second surface of the build-up shape as the exposed top surface of the build-up shape.

10. The method of claim 1, wherein the encapsulation material secures the build-up shape to the electrical component.

11. The method of claim 1, wherein the conductive adhesive material is applied as a plurality of structures to the electrical component.

12. The method of claim 1, wherein the conductive adhesive material is an electrically conductive adhesive (ECA), and wherein the conductive interconnect is configured to electrically connect an embedded surface of the electrical component to an outer surface of the electrical component package.

13. The method of claim 1, wherein the conductive adhesive material is a thermally conductive adhesive (TCA), and wherein the conductive interconnect is configured to thermally connect an embedded surface of the electrical component to an outer surface of the electrical component package.

14. The method of claim 1, wherein the conductive adhesive material is an optically conductive adhesive, and wherein the conductive interconnect is configured to optically connect an embedded surface of the electrical component to an outer surface of the electrical component package.

15. The method of claim 1, wherein the build-up shape comprises at least one of a group of shapes including a conical shape, a rectangular shape, a circular shape, and a trapezoidal shape.

* * * * *